(12) United States Patent
Yang et al.

(10) Patent No.: US 12,148,607 B2
(45) Date of Patent: *Nov. 19, 2024

(54) HIGH POWER TUNGSTEN HALOGEN LAMP LIFETIME IMPROVEMENT THROUGH J-HOOK DESIGN

(71) Applicant: Applied Materials, Inc., Santa Clara, CA (US)

(72) Inventors: Yao-Hung Yang, Santa Clara, CA (US); Shantanu Rajiv Gadgil, Santa Clara, CA (US); Kaushik Rao, Bangalore (IN); Vincent Joseph Kirchhoff, Santa Clara, CA (US); Sagir Kadiwala, Santa Clara, CA (US); Munirah Mahyudin, Santa Clara, CA (US); Daniel Chou, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/412,127

(22) Filed: Jan. 12, 2024

(65) Prior Publication Data
US 2024/0162030 A1    May 16, 2024

Related U.S. Application Data

(63) Continuation of application No. 18/196,341, filed on May 11, 2023, now Pat. No. 11,881,392, which is a
(Continued)

(51) Int. Cl.
  *H01K 1/20*     (2006.01)
  *H01K 7/00*     (2006.01)
(52) U.S. Cl.
  CPC .................. *H01K 1/20* (2013.01); *H01K 7/00* (2013.01)

(58) Field of Classification Search
  CPC .. H01K 1/18; H01K 1/14; H01K 1/20; H01K 7/00
  See application file for complete search history.

(56) References Cited

U.S. PATENT DOCUMENTS

| | | |
|---|---|---|
| 3,684,883 A | 8/1972 | Entwistle |
| 3,829,729 A | 8/1974 | Westlund, Jr. et al. |
| (Continued) | | |

FOREIGN PATENT DOCUMENTS

| | | |
|---|---|---|
| JP | 2000091233 A | 3/2000 |
| KR | 100407359 B1 | 11/2003 |

OTHER PUBLICATIONS

PCT/US2022/030075, International Search Report and Written Opinion dated Jan. 12, 2023, 12 pages.
(Continued)

*Primary Examiner* — Joseph L Williams
(74) *Attorney, Agent, or Firm* — Patterson + Sheridan, LLP (57) ABSTRACT

A lamp and epitaxial processing apparatus are described herein. In one example, the lamp includes a bulb, a filament, and a plurality of filament supports disposed in spaced-apart relation to the filament, each of the filament supports having a hook support and a hook. The hook includes a connector configured to fasten the hook to the hook support, a first vertical portion extending from the connector toward the filament, and a rounded portion extending from an end of the first vertical portion distal from the connector and configured to wrap around the filament. A second vertical portion extends from an end of the rounded portion distal from the first vertical portion and the second vertical portion has a length between 60% and 100% of the length of the first vertical portion.

20 Claims, 6 Drawing Sheets

Related U.S. Application Data continuation of application No. PCT/US2022/030075, filed on May 19, 2022.

(56) References Cited

U.S. PATENT DOCUMENTS

| | | |
|---|---|---|
| 4,994,707 A | 2/1991 | Stark |
| 6,336,837 B1 | 1/2002 | Maeda |
| 11,881,392 B2 * | 1/2024 | Yang ................... H01K 1/20 |
| 2016/0203970 A1 | 7/2016 | Urushibara et al. |
| 2021/0285892 A1 | 9/2021 | Raj et al. |

OTHER PUBLICATIONS

PCT/US2022/025063, International Search Report and Written Opinion dated Jan. 13, 2023, 12 pages.

* cited by examiner

HIGH POWER TUNGSTEN HALOGEN LAMP LIFETIME IMPROVEMENT THROUGH J-HOOK DESIGN

CROSS-REFERENCE TO RELATED APPLICATIONS

This application is a continuation of U.S. patent application Ser. No. 18/196,341, filed May 11, 2023 and claims the benefit of PCT Application No. PCT/US2022/30075, filed May 19, 2022, which are herein incorporated by reference.

BACKGROUND

Field

Embodiments of the present disclosure generally relate to thermal processing of thin films on substrates such as silicon wafers. In particular, embodiments of the disclosure relate to apparatuses used to support a filament in a lamp used to produce radiation for such thermal processing.

Description of the Related Art

In solid-state integrated circuit fabrication, epitaxial processing is typically performed in an epitaxial processing chamber. A substrate disposed on a susceptor in the epitaxial processing apparatus is typically heated by lamps positioned over and/or under the substrate. The susceptor is typically heated by lamps positioned under the susceptor. Upper dome and lower dome, which may be quartz, enclose the processing chamber. Lift arms and susceptor arms move so as to separate from each other, thus separating the substrate from the susceptor, and so as to position the processed substrate to be removed from the processing chamber by a robot and replaced by a substrate that is to be processed within the processing chamber.

The lamps maintain the temperature of the substrate and the susceptor. In the event that a lamp burns out, the processing chamber is taken out of production and one or more of the lamps are replaced. These lamp failures incur heavy costs for manufacturers due to the downtime needed to replace the failed lamps. In order to avoid premature failure of the lamps, lamps which survive the transportation/delivery process without incurring defects are preferable. For instance, premature failure can occur when a filament of the lamp becomes dislodged from one or more filament supports.

Figure 2:
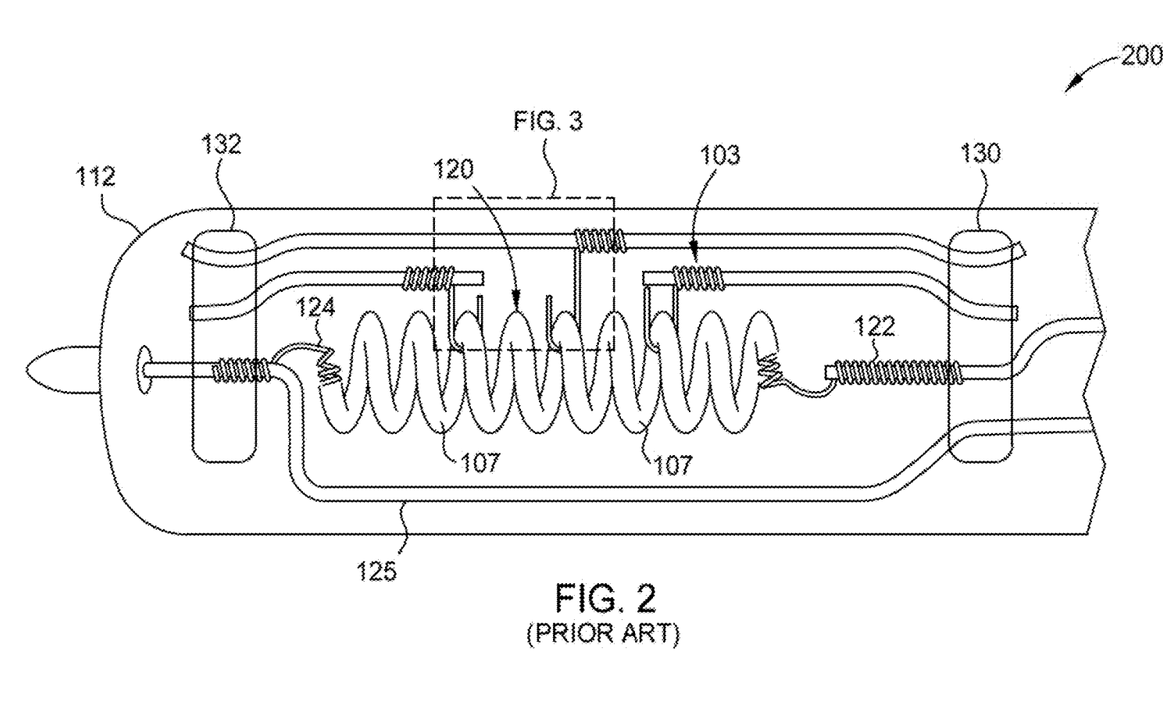
FIG. 2 illustrates a conventional lamp for epitaxial processing.

FIG. 2 depicts a conventional lamp 200 that may be used for epitaxial processing in a processing chamber as described above. The lamp 200 includes a bulb 112, a filament 120, a plurality of filament supports 103, a ground wire 125, a first glass support 130, and a second glass support 132. The filament 120 is typically fabricated from an annealed tungsten or other suitable material. The filament 120 is generally configured to be a coil spring or the like, with a plurality of individual coils 107. The first and second glass support 130, 132 are configured to support the filament 120, filament supports 103, and the ground wire 125 within the lamp 200. The plurality of filament supports 103 are configured to be disposed within the bulb 112 in spaced-apart relation to the filament 120. The filament 120 further includes a first filament lead 122 and a second filament lead 124. The first filament lead 122 is configured to enter the bulb 112 from an electrical potential source (not shown) as a cathode for the filament 120, while the second filament lead 124 is configured contact the ground wire 125 as an anode for the filament 120. The ground wire 125 is configured to exit the bulb 112 and connect to an electrical ground (not shown).

In typical operation of the lamp 200 for use in epitaxial processing, an electrical current is applied to the filament 120, causing the filament 120 to radiate light and heat. In some embodiments, the filament 120 is made of tungsten or other suitable conductor. Tungsten filaments radiate infrared radiation at temperatures up to about 3400 degrees Celsius. It is to be understood that other metals may be utilized without departing from the scope of the disclosure. The bulb 112 is filled with a halogen gas. Other gases may also be used in the bulb 112. When a potential is applied between the first filament lead 122 and the second filament lead 124 from the electrical potential source, the tungsten in the filament 120 is excited and evaporates. The evaporated tungsten reacts and combines with the halogen gas to create a tungsten-halogen molecule. The tungsten-halogen molecules will then migrate towards the bulb 112. As the tungsten-halogen molecule moves away from the filament, the temperature decreases, causing the bulb 112 to push the tungsten-halogen molecule back towards the filament 120 and severing the bond between the tungsten and the halogen. The evaporated tungsten is then redeposited on the filament 120. When the evaporated tungsten is redeposited onto the filament 120, however, it does not necessarily redeposit in the same area of the filament 120 from which it evaporated. After repeated cycling of the halogen lamp, the filament 120 will tend to begin to sag as the tungsten redeposits on the lower portion of the filament 120, eventually causing either the individual coils 107 to contact each other, causing a short circuit, or the filament 120 to break, leading to a failure of the lamp 200.

Figure 3:
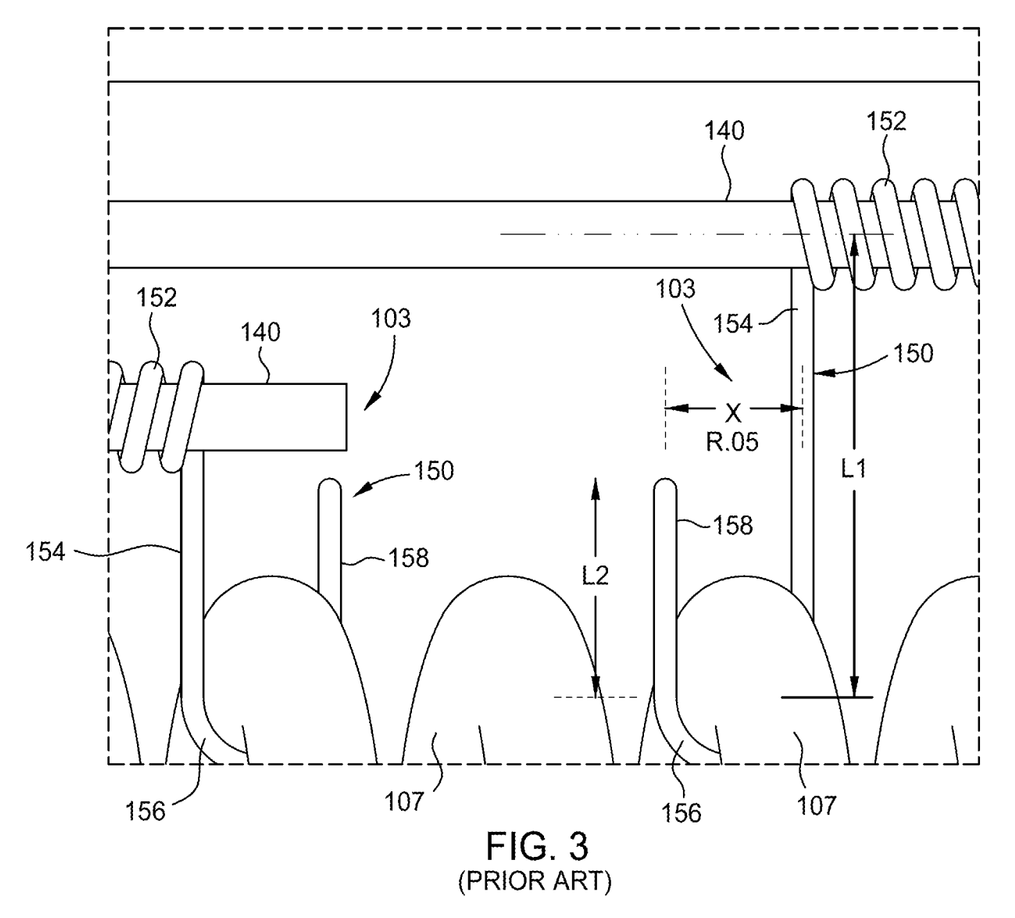
FIG. 3 illustrates conventional filament supports for supporting a filament.

Referring to FIG. 3, the filament supports 103 are shown. Each of the filament supports 103 further includes a hook support 140 and a hook 150. The hook 150 further includes a connector 152, a first vertical portion 154, a rounded portion 156, and a second vertical portion 158. The connector 152 is configured to couple the hook 150 to the hook support 140. The connector 152 is typically a wire that is coiled around the hook support 140 one or more times to secure the hook 150 to the hook support 140. The connector 152 can be welded or otherwise fastened to further secure the hook 150 to the hook support 140. The first vertical portion 154 of the hook 150 is configured to extend from the connector 152 of the hook 150 toward the filament 120. The rounded portion 156 of the hook 150 extends from an end of the first vertical portion 154 that is distal to the connector 152. The rounded portion 156 is further configured to wrap around the filament 120 in order to support the filament within the bulb 112. The second vertical portion 158 is configured to extend from an end of the rounded portion 156 that is distal from the first vertical portion 154.

Typically, the lamp 200 of the prior art features a hook 150 that is a J-hook. The length L2 of the second vertical portion 158 is, in one embodiment, less than 60% of the length L1 of the first vertical portion 154. In particular, the second vertical portion 158 is between 45% and 55% of the length of the first vertical portion 154. In one embodiment, the length L1 of the first vertical portion 154 is between 0.24 inches and 0.26 inches, while the length L2 of the second vertical portion 158 is between 0.123 inches and 0.127 inches. The lengths and length ratios of the prior art J-hook enabled premature failure of the part due to the rigors of shipping/transport, and also contributed to failure within the epitaxial processing apparatus 100. Accordingly, any vibration or agitation that was experienced by the lamp 200 could result in the filament 120 being dislodged from the hook 150. Moreover, the lack of structural support for the lamp 200 exacerbates the effect of sagging caused by redeposition of the evaporated tungsten which leads to premature lamp failure.

Therefore, what is needed in the art is a filament support that provides adequate support to the filament without diminishing performance of the lamp in a desired application.

SUMMARY

Embodiments of the present disclosure generally relate to thermal processing of thin films on substrates such as silicon wafers. In particular, embodiments of the disclosure relate to an improved lamp and epitaxial processing apparatuses having the same.

In one embodiment, a lamp is disclosed. The lamp comprises a bulb, a filament, and a plurality of filament supports disposed in spaced-apart relation to the filament. The plurality of filament supports include at least a first filament support and a second filament support. Each of the filament supports further includes a hook support and a hook. The hook includes a connector, a first vertical portion, a rounded portion, and a second vertical portion. The connector is configured to fasten the hook to the hook support. The first vertical portion extends from the connector toward the filament. The rounded portion extends from an end of the first vertical portion distal from the connector and is configured to wrap around the filament. The second vertical portion extends from an end of the rounded portion distal from the first vertical portion. The second vertical portion of the first filament support has a length between 60% and 100% of the length of the first vertical portion of the first filament support. The first vertical portion of the first filament support is longer than the first vertical portion of the second filament support.

In another embodiment, an epitaxial processing apparatus is disclosed. The apparatus includes a processing chamber, a susceptor within the processing chamber, and a plurality of lamps. The susceptor is configured to support a substrate. The processing chamber defined by an upper dome and a lower dome. The plurality of lamps are positioned over the upper dome and positioned under the lower dome. The lamps include a bulb, a filament, and a plurality of filament supports disposed in spaced-apart relation to the filament. The plurality of filament supports include at least a first filament support and a second filament support. Each of the filament supports further comprising a hook support and a hook. The hook comprises a connector, a first vertical portion, a rounded portion, and a second vertical portion. The connector is configured to fasten the hook to the hook support. The first vertical portion extends from the connector toward the filament. The rounded portion extends from an end of the first vertical portion distal from the connector and is configured to wrap around the filament. The second vertical portion extends from an end of the rounded portion distal from the first vertical portion. The second vertical portion of the first filament support has a length between 60% and 100% of the length of the first vertical portion of the first filament support. The first vertical portion of the first filament support is longer than the first vertical portion of the second filament support.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to thermal processing of thin films on substrates. In particular, embodiments of the disclosure relate to apparatus used to support a filament in a lamp used to produce radiation for such thermal processing.

Figure 1:
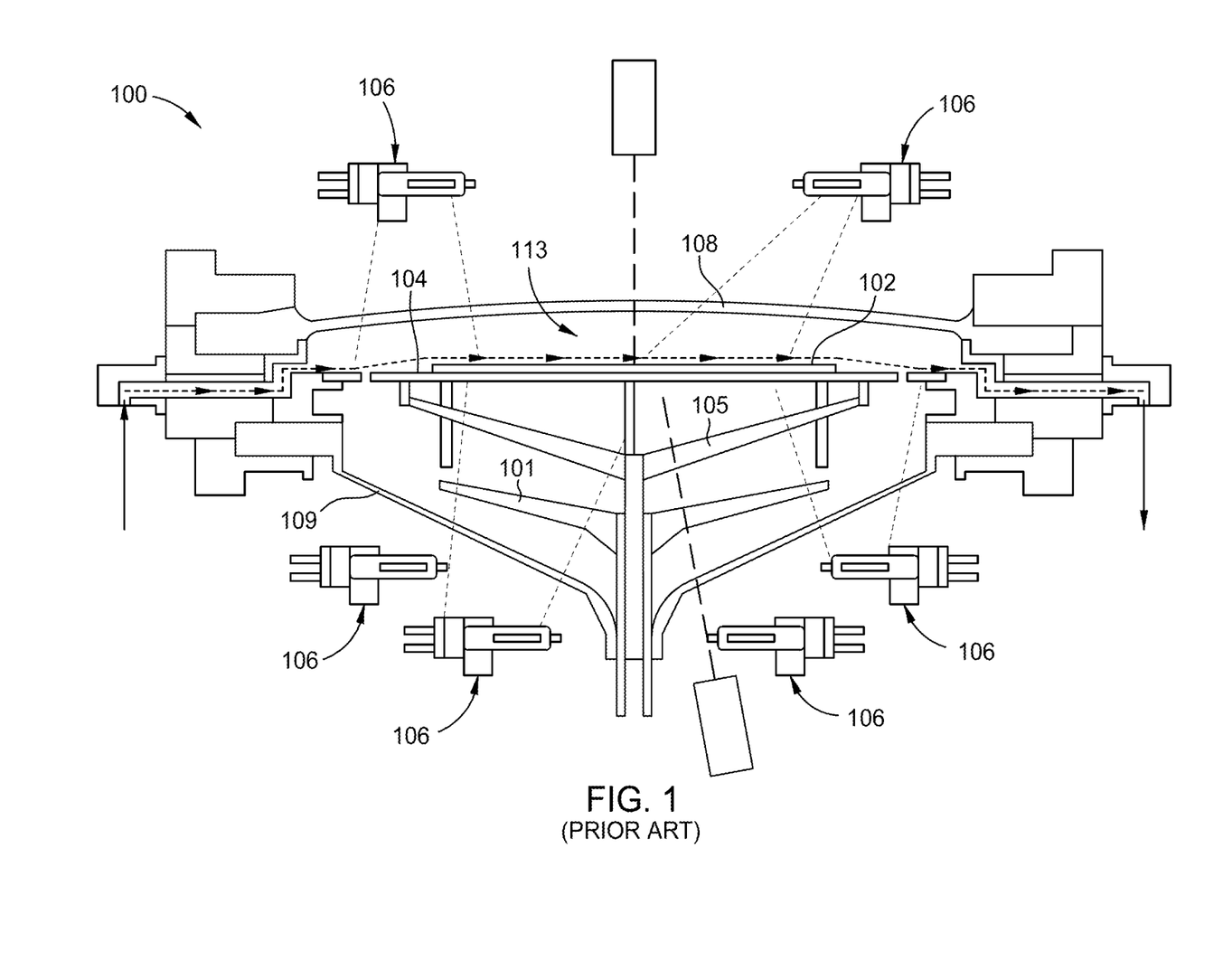
FIG. 1 illustrates a cross-section of an epitaxial system.

FIG. 1 illustrates an epitaxial processing apparatus 100 that may be used for epitaxial processing. The epitaxial processing apparatus 100 includes improved lamps 106. A substrate 102 disposed in the processing apparatus 100 is typically heated by lamps 106 positioned over and/or under the substrate 102. A susceptor 104 is typically heated by lamps 106 positioned under the susceptor 104. Upper dome 108 and lower dome 109, which may be quartz, enclose the processing chamber 113. Lift arms 101 and susceptor arms 105 move so as to separate from each other, thus separating the substrate 102 from the susceptor 104, and so as to position the processed substrate 102 to be removed from the processing chamber 113 by a robot (not shown) and replaced by a substrate 102 that is unprocessed.

Figure 4:
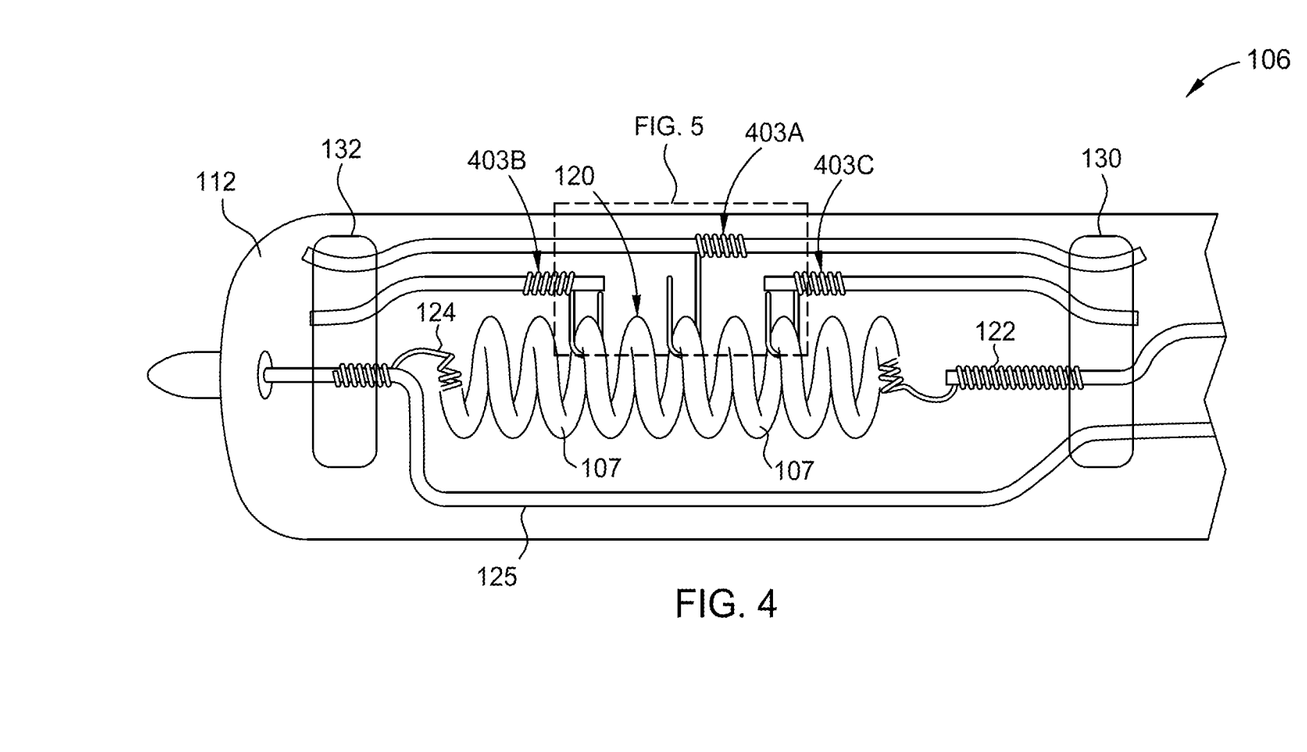
FIG. 4 illustrates a lamp for epitaxial processing according to an embodiment of the disclosure.

The lamp 106 is configured to provide adequate support for a filament 120. Referring to FIG. 4, additional details of a lamp 106 for epitaxial processing is shown. The lamp 106 includes a bulb 112, a filament 120, a plurality of filament supports, a ground wire 125, a first glass support 130, and a second glass support 132. According to some embodiments, the filament 120 is comprised of an annealed tungsten or other suitable material. In some embodiments, the filament 120 is configured to be a coil spring, with a plurality of individual coils 107. The first and second glass support 130, 132 are configured to support the filament 120, filament supports, and ground wire 125 within the lamp 106. The first glass support 130 and the second glass support 132 are disposed in spaced apart relation within the bulb 112. The filament 120 is disposed in the bulb 112 and extending between the first glass support 130 and the second glass support 132. The plurality of filament supports are configured to be disposed within the bulb 112 in a spaced-apart relation to the filament 120. In one embodiment, the lamp 106 includes 3 filament supports (e.g., a filament support 403A, a filament support 403B, and a filament support 403C) spaced equidistance along the filament 120 for maximum support. The filament 120 further includes a first filament lead 122 and a second filament lead 124. The first filament lead 122 is configured to enter the bulb 112 from an electrical potential source as a cathode for the filament 120, while the second filament lead 124 is configured contact the ground wire 125 as an anode for the filament 120. The ground wire 125 is configured to exit the bulb 112 and connect to an electrical ground.

Figure 5:
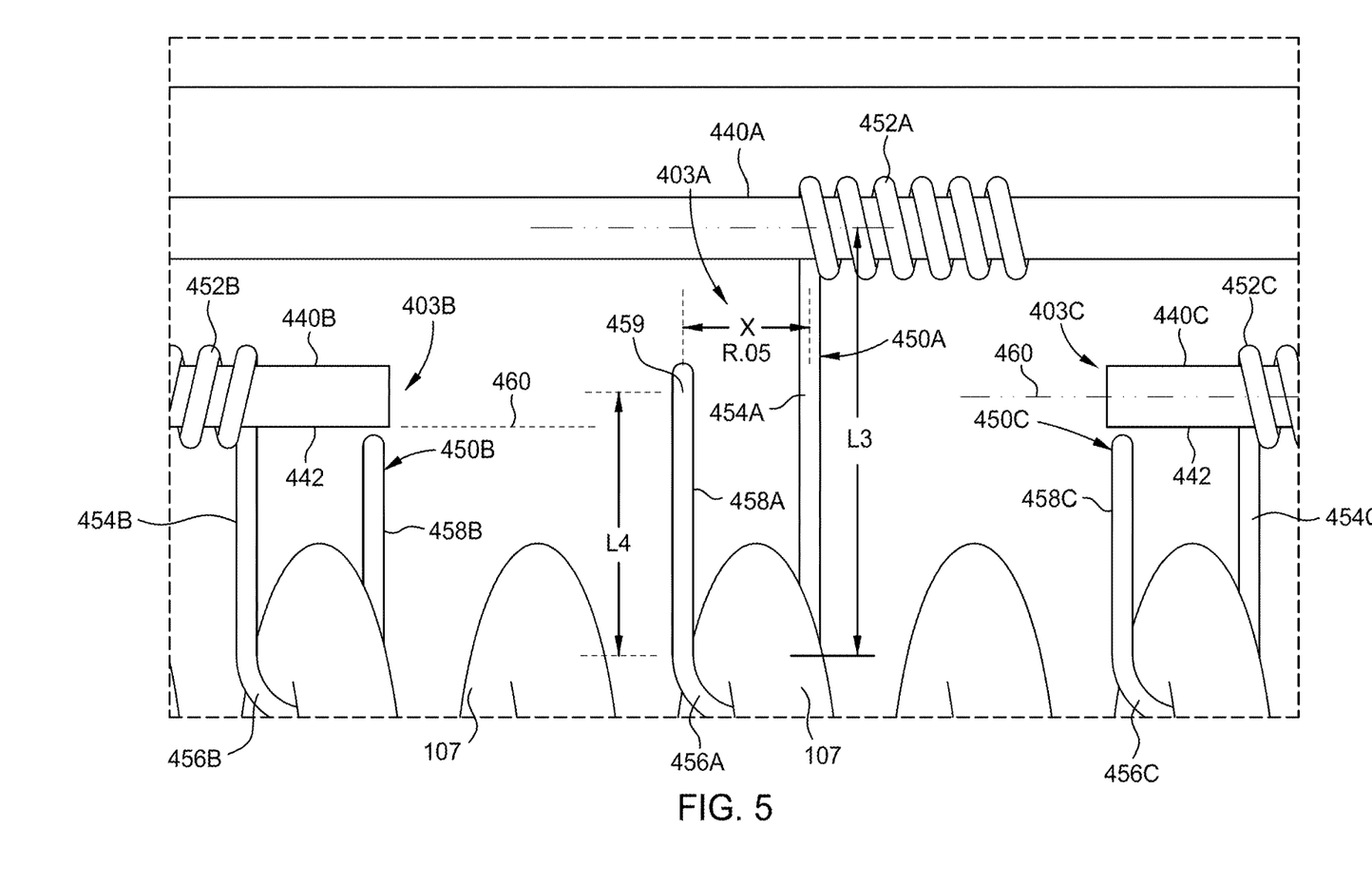
FIG. 5 illustrates a filament support for supporting a filament according to an embodiment of the disclosure.

Referring to FIG. 5, the plurality of filament supports are shown. The plurality of filament supports further include at least a first filament support 403A and a second filament support 403B. Each of the filament supports further includes a hook support and a hook. The first filament support 403A includes a first hook support 440A and first hook 450A, and the second filament support 403B includes a second hook support 440B and second hook 450B. The first hook support 440A of the first filament support 403A is coupled to the first glass support 130 and the second glass support 132. The second hook support 440B of the second filament support 403B is coupled to the second glass support 132. The first hook 450A is coupled to the first hook support 440A. The first hook 450A further includes a connector 452A, a first vertical portion 454A, a rounded portion 456A, and a second vertical portion 458A. The first vertical portion 454A extends from the first hook support 440A toward the filament 120. The rounded portion 456A extends from an end of the first vertical portion 454A distal from the first hook support 440A and configured to wrap around the filament 120. The second vertical portion 458A extends from an end of the rounded portion 456A distal from the first vertical portion 454A to an end 459 at an elevation beyond an edge 442 of the second hook support 440B closest to the filament 120, as indicated by line 460. The second hook 450B is coupled to the second hook support 440B. The second hook 450B further includes a connector 452B, a first vertical portion 454B, a rounded portion 456B, and a second vertical portion 458B. The first vertical portion 454B extends from the second hook support 440B toward the filament 120. The rounded portion 456B extends from an end of the first vertical portion 454B distal from the second hook support 440B. The rounded portion 456B is configured to wrap around the filament 120. The second vertical portion 458B extends from an end of the rounded portion 456B distal from the first vertical portion 454B. In general, the first connector 452A is configured to couple the first hook 450A to the first hook support 440A and the second connector 452B is configured to couple the second hook 450B to the second hook support 440B. In one embodiment, the first connector 452A and the second connector 452B are comprised of a wire that is coiled around the first hook support 440A and the second hook support 440B, respectively, one or more times to secure the first hook 450A to the first hook support 440A and the second hook 450B to the second hook support 440B. In one embodiment, the first connector 452A and the second connector 452B can be welded to further secure the first hook 450A to the first hook support 440A and the second hook 450B to the second hook support 440B. The first vertical portion 454A of the first hook 450A and the first vertical portion 454B of the second hook 450B are configured to extend from the first connector 452A of the first hook and the second connector 452B of the second hook 450B, respectively, toward the filament 120.

In one embodiment, a third filament support 403C includes a third hook support 440C and a third hook 450C. The third hook support 440C is coupled to the first glass support 130. The third hook 450C includes a connector 452C, a first vertical portion 454C, a rounded portion 456C, and a second vertical portion 458C. The first vertical portion 454C extends from the third hook support 440C toward the filament 120. The rounded portion 456C extends from an end of the first vertical portion 454C distal from the third hook support 440C and configured to wrap around the filament 120. The second vertical portion 458C extends from an end of the rounded portion 456C distal from the first vertical portion 454C. The second vertical portion 458A of the first hook 450A extends from an end of the rounded portion 456A distal from the first vertical portion 454A to an end 459 above an elevation beyond an edge of the third hook 450C closest to the filament 120 (not shown).

The rounded portion (e.g., first rounded portion 456A, second rounded portion 456B, and third rounded portion 456C) of the hook (e.g., the first hook 450A, the second hook 450B, and third hook 450C) extends from a first end of the first vertical portion (e.g., the first vertical portion 454A, second vertical portion 454B, and third vertical portion 454C) that is distal to the connector (e.g., first connector 452A, second connector 452B, and third connector 452C). The rounded portion is further configured to wrap around the filament 120 in order to support the filament 120 within the bulb 112. In one embodiment, the rounded portion of the hook is configured to be a semi-circle or partial semi-circle. In one embodiment, the radius R2 of the semi-circle of the rounded portion is 0.5 inches. The rounded portion is further configured to contact less than 50% of a circumference of the filament 120, such as contacting less than 45% of the circumference of the filament 120, such as contacting less than 35% of the circumference of the filament 120, such as contacting less than 25% of the circumference of the filament 120. By contacting the less than 50% of the circumference of the filament 120, the rounded portion is able to limit the effect of the filament support (e.g., the first filament support 403A, second filament support 403B, and third filament support 403C) on the performance of the lamp 106, as will be discussed below. The second vertical portion (e.g., the second vertical portion 458A, second vertical portion 458B, and second vertical portion 458C) is configured to extend from a first end of the rounded portion distal from the first end of the first vertical portion. In one embodiment, the second vertical portion extends away from the filament 120 in parallel to the first vertical portion.

In one embodiment, the lamp 106 features a hook (e.g., first hook 450A, second hook 450B, and third hook 450C) that is a J-hook. The second vertical portion 458A is configured to have a length L4 that is between 60% and 100% of the length L3 of the first vertical portion 454A. In another embodiment, the second vertical portion 458A has a length L4 between 65% and 85% of the length L3 of the first vertical portion 454A. In one embodiment, the second vertical portion 458A has a length L4 between 70% and 80% of the length L3 of the first vertical portion 454A. In one embodiment, the second vertical portion 458A has a length L4 between 74% and 77% of the length L3 of the first vertical portion 454A. In one embodiment, the length L3 of the first vertical portion 454A is between 0.2 and 0.3 inches, such as between 0.24 and 0.26 inches. In one embodiment, the length L4 of the second vertical portion 458A is between 0.15 inches and 0.25 inches, such as between 0.178 inches and 0.202 inches.

By increasing the lengths and length ratios of the length L4 of the second vertical portion (e.g., the second vertical portion 458A, the second vertical portion 450B, and second vertical portion 450C) to greater than 60% of the length L3 of the first vertical portion 454, the ability of the filament 120 to be dislodged from the hook (e.g., the first hook 450A, the second hook 450B, and third hook 450C) is significantly reduced, thus reducing premature failure due to malfunctions during shipping/transport and while in the epitaxial processing apparatus 100. In order to dislodge the filament 120 from the hook, a significantly larger magnitude of vibration or agitation would be necessary. Thus, while in use, the structural support keeping the individual coils 107 from contacting each other, and the effects of sagging caused by redeposition of the evaporated tungsten, are limited, leading to less premature failures.

In one embodiment of the lamp 106, the first vertical portion 454A of the first filament support 403A is longer than the first vertical portion 454B of the second filament support 403B. The first filament support 403A is further configured to be spaced further apart from the filament 120 than the second filament support 403B. In another embodiment, the lamp 106 is configured to include a third filament support 403C. The first filament support 403A is configured to be in between the second filament support 403B and the third filament support 403C. Further, the first vertical portion 454A of the first filament support 403A is longer than the first vertical portion 454B of the second filament support 403B and the first vertical portion (not shown) of the third filament support 403C. The first filament support 403A is spaced further apart from the filament 120 than the second filament support 403B and third filament support 403C.

Figure 6:
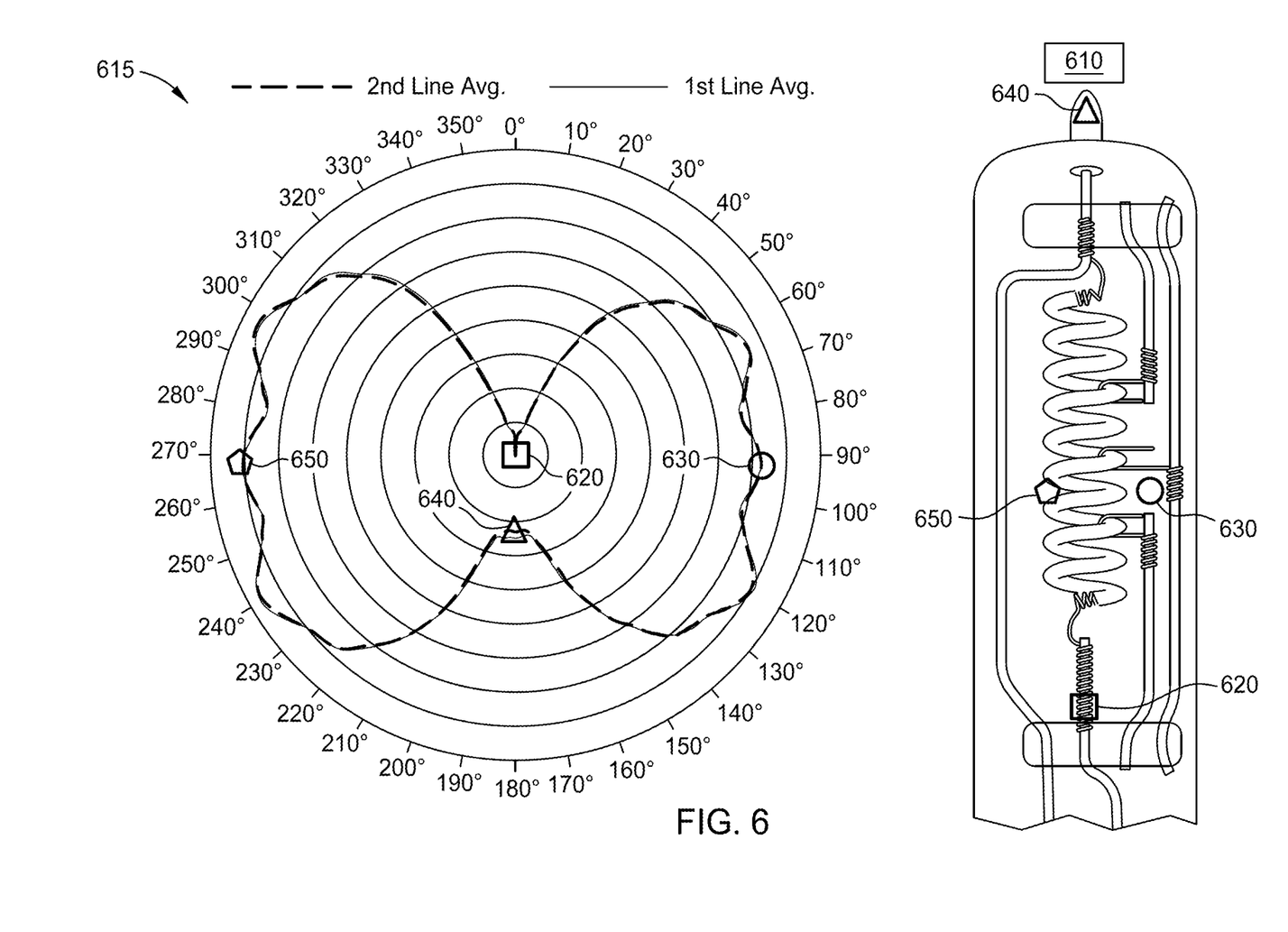
FIG. 6 illustrates a light intensity map according to an embodiment of the disclosure.

Referring to FIG. 6, the lamp 106 was configured to rotate around a sensor 610 in order to create the plot 615. The plot 615 shows the light intensity of the lamp 106 during the rotation of the lamp 106. At a 0° mark, the sensor 610 is positioned such that region 620 is facing the sensor 610. When sensor 610 is facing region 620, no or a negligible amount of light is measured. As the lamp 106 is rotated toward the 90° mark, the region 630 faces the lamp 106. The intensity of light is significantly higher at the 90° mark as the filament 120 is facing directly at the sensor 610. The plot 615 continues to region 640 at the 180° mark and region 650 at the 270° mark. As the lamp 106 rotates from region 630 to region 640, the filament 120 no longer faces directly towards the sensor 610 and the intensity of light decreases. As region 650 is approached, the light intensity increases due to the filament 120 facing directly toward the sensor 610. At region 650, the light intensity if greater than the intensity at region 630. This is due in part to the fact that at region 630, there are a plurality of filament supports (e.g., first filament support 403A, second filament support 403B, and third filament support 403C). The filament supports obstruct a portion of the light emitted from the lamp 106. At region 650, however, there is only the ground wire 125, and thus less light is obstructed. By extending away from the rounded portion (e.g., rounded portion 456A, rounded portion 456B, and rounded portion 456C) of the hook (e.g., the first hook 450A, second hook 450B, and third hook 450C) in parallel, the first and second vertical portions further limit the amount of light that is obstructed by the hook, allowing for more efficient heating of the susceptor 104 and substrate 102. Similarly, by limiting the amount of contact between the rounded portion and the filament 120, the amount of light obstructed by the hook is decreased, once again enabling more efficient heating of the susceptor 104 and substrate 102.

In addition to decreasing the amount of light that is obstructed by the hook by limiting the amount of contact between the rounded portion and the filament 120, the limited amount of contact between the rounded portion and the filament 120 prolongs the life cycle of the lamp 106. The filament 120, when a potential is applied across it, rises to high temperatures (i.e., between 600° C. and 1200° C.). The hook, however, does not rise to as high of a temperature because there is no potential being applied to the hook. Thus, at the interface of the rounded portion of the hook and the filament 120, there is a tendency for cold spots to occur. The occurrence of cold spots can affect the halogen-tungsten bonding process and result in a less even redeposition process, leading to an increase in the sagging of the filament and thus an earlier failure. By limiting the amount of contact between the rounded portion of the hook and the filament 120, the number of cold spots is reduced, leading to a more efficient halogen-tungsten bonding process and more even redeposition process.

In summation, described herein is a lamp including a bulb, a filament, and a plurality of filament supports disposed in spaced-apart relation to the filament. Each of the filament supports further comprising a hook support and a hook. The hook includes a connector, the connector being configured to fasten the hook to the hook support, a first vertical portion, the first vertical portion extending from the connector to toward the filament, a rounded portion extending from an end of the first vertical portion distal from the connector and configured to wrap around the filament, and a second vertical portion, the second vertical portion extending from an end of the rounded portion distal from the first vertical portion, the second vertical portion having a length between 60% and 100% of the length of the first vertical portion. The lamp provides for sufficient support to prevent defects from forming during shipping/transportation, thus decreasing premature failures, while have a minimal effect on the ability of the lamp to efficiently heat the substrate and susceptor.

While the foregoing is directed to embodiments of the present disclosure, other and further embodiments of the disclosure may be devised without departing from the basic scope thereof, and the scope thereof is determined by the claims that follow.

What is claimed is:

1. A lamp, comprising:
    a bulb;
    a first glass support and a second glass support disposed in a spaced apart relation within the bulb;
    a filament disposed in the bulb and extending between the first and second glass supports;
    a first hook support coupled to the first and second glass supports;
    a second hook support coupled to the second glass support;
    a first hook coupled to the first hook support, wherein the first hook comprises:
        a first vertical portion extending from the first hook support toward the filament; and
        a second vertical portion extending toward the first hook support; and
    a second hook coupled to the second hook support, wherein the second hook comprises:
        a first vertical portion extending from the second hook support toward the filament; and
        a second vertical portion extending toward the second hook support.

2. The lamp of claim 1, further comprising a third hook support coupled to the first glass support, the second vertical portion of the first hook; and
    a third hook coupled to the third hook support, wherein the third hook support comprises:

a first vertical portion extending from the second hook support toward the filament; and a second vertical portion extending toward the third hook support.

3. The lamp of claim 2, wherein the second hook support and the third hook support are cantilevered from the second glass support and the first glass support, respectively.

4. The lamp of claim 2, wherein the first hook support is supported by the first glass support and the second glass support.

5. The lamp of claim 2, wherein the first hook support is spaced further apart from the filament than one of the second hook support and the third hook support.

6. The lamp of claim 2, wherein the second vertical portion of the of the first hook support is longer than one of the second vertical portion of the second hook support and the second vertical portion of the third hook support.

7. The lamp of claim 2, wherein the first vertical portion of the first hook support is longer than one of the first vertical portion of the second hook support and the first vertical portion of the third hook support.

8. The lamp of claim 1, wherein the second vertical portion of the first hook support has a length between 60% and 100% of the length of the first vertical portion of the first hook support.

9. A lamp, comprising:

a bulb;

a filament; and a plurality of filament supports disposed in spaced-apart relation to the filament, the plurality of filament supports comprising at least a first filament support and a second filament support, each of the filament supports further comprising a hook support and a hook, wherein the hook comprises:
 a connector, the connector being configured to fasten the hook to the hook support;
 a first vertical portion, the first vertical portion extending from the connector toward the filament; and
 a second vertical portion, the second vertical portion extending toward the hook support, wherein the second vertical portion of the first filament support has a length between 60% and 100% of the length of the first vertical portion of the first filament support; and wherein the first vertical portion of the first filament support is longer than the first vertical portion of the second filament support.

10. The lamp of claim 9, wherein the second vertical portion has a length between 70% and 80% of the length of the first vertical portion.

11. The lamp of claim 10, wherein the second vertical portion has a length between 74% and 77% of the length of the first vertical portion.

12. The lamp of claim 9, wherein the length of the first vertical portion is between 0.2 and 0.3 inches.

13. The lamp of claim 12, wherein the length of the first vertical portion is between 0.24 and 0.26 inches.

14. The lamp of claim 9, wherein the length of the second vertical portion is between 0.05 inches and 0.7 inches.

15. The lamp of claim 14, wherein the length of the second vertical portion is between 0.178 inches and 0.202 inches.

16. The lamp of claim 9, wherein the hook is contact with less than 50% of a circumference of the filament.

17. The lamp of claim 9, further comprising a third filament support, wherein the first filament support is in between the second filament support and the third filament support.

18. The lamp of claim 17, wherein the first vertical portion of the first filament support is longer than the first vertical portion of the second filament support and the first vertical portion of the third filament support.

19. The lamp of claim 18, wherein the first filament support is spaced further apart from the filament than the second filament support and third filament support.

20. An epitaxial processing apparatus, the apparatus comprising:

a processing chamber, the processing chamber defined by an upper dome and a lower dome;

a susceptor within the processing chamber, the susceptor being configured to support a substrate;

a plurality of lamps positioned over the upper dome and positioned under the lower dome, the lamps comprising:
 a bulb;
 a filament; and
 a plurality of filament supports disposed in spaced-apart relation to the filament, the plurality of filament supports comprising at least a first filament support and a second filament support, each of the filament supports further comprising a hook support and a hook, wherein the hook comprises:
  a connector, the connector being configured to fasten the hook to the hook support;
  a first vertical portion, the first vertical portion extending from the connector toward the filament; and
  a second vertical portion, the second vertical portion extending toward the hook support, wherein the second vertical portion of the first filament support has a length between 60% and 100% of the length of the first vertical portion of the first filament support; and wherein the first vertical portion of the first filament support is longer than the first vertical portion of the second filament support.

* * * * *